(12) United States Patent
Saito

(10) Patent No.: US 9,894,794 B2
(45) Date of Patent: Feb. 13, 2018

(54) PORTABLE WIRELESS KEY

(71) Applicant: DENSO CORPORATION, Kariya, Aichi-pref. (JP)

(72) Inventor: Toshiaki Saito, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/032,573

(22) PCT Filed: Oct. 15, 2014

(86) PCT No.: PCT/JP2014/005222
§ 371 (c)(1),
(2) Date: Apr. 27, 2016

(87) PCT Pub. No.: WO2015/064033
PCT Pub. Date: May 7, 2015

(65) Prior Publication Data
US 2016/0278229 A1 Sep. 22, 2016

(30) Foreign Application Priority Data
Oct. 30, 2013 (JP) .................................. 2013-225035

(51) Int. Cl.
*H05K 5/00* (2006.01)
*H05K 7/14* (2006.01)
(Continued)

(52) U.S. Cl.
CPC ....... *H05K 7/1427* (2013.01); *G07C 9/00174* (2013.01); *G07C 9/00944* (2013.01);
(Continued)

(58) Field of Classification Search
CPC ............... H05K 7/1427; H01H 9/0235; H01H 2231/026; G07C 9/00174; G07C 9/00944; G07C 2009/00769
(Continued)

(56) References Cited

U.S. PATENT DOCUMENTS 5,822,192 A * 10/1998 Hayashi ................. H05K 5/068
174/50
6,700,086 B2 * 3/2004 Serizawa ............. H01H 13/702
200/512

(Continued)

FOREIGN PATENT DOCUMENTS

EP 2474952 A2 7/2012
JP H9-139148 A 5/1997
(Continued)

*Primary Examiner* — Hung S Bui
(74) *Attorney, Agent, or Firm* — Harness, Dickey & Pierce, P.L.C.

(57) ABSTRACT

Provided is a portable wireless key that performs a control pertaining to locking and unlocking of a vehicle door lock according to a pressing operation of a movable projection of a push switch and is capable of improving an operational feeling at a low cost. A hard deformable cover is disposed between an operation portion of a switch operation cover and the movable projection of the push switch. The switch operation cover is deformed to be depressed according to a user's pressing operation, and deformed to be restored to an original position when the user's pressing operation is released. Since the hard deformable cover is deformed to press the movable projection with a depressing deformation of the operation portion by the user's pressing operation, the operational feeling of the movable projection can be improved at a low cost.

11 Claims, 10 Drawing Sheets

(51) Int. Cl.
   *H01H 9/02*   (2006.01)
   *G07C 9/00*   (2006.01)

(52) U.S. Cl.
   CPC . *H01H 9/0235* (2013.01); *G07C 2009/00769* (2013.01); *H01H 2231/026* (2013.01)

(58) Field of Classification Search
   USPC .......................................... 361/728–730, 752
   See application file for complete search history.

(56) References Cited

U.S. PATENT DOCUMENTS

| | | | | |
|---|---|---|---|---|
| 7,897,888 | B2* | 3/2011 | Dimig | E05B 19/0082 200/302.2 |
| 8,575,506 | B2* | 11/2013 | Kitahara | H01H 13/06 200/302.2 |
| 2004/0200709 | A1* | 10/2004 | Sugimoto | H01H 9/0235 200/302.2 |
| 2004/0201451 | A1* | 10/2004 | Sugimoto | B60R 25/406 340/5.62 |
| 2004/0201512 | A1* | 10/2004 | Sugimoto | E05B 19/0082 341/176 |
| 2005/0051416 | A1* | 3/2005 | Mahoney | H01H 13/70 200/512 |
| 2008/0237013 | A1 | 10/2008 | Shibuya et al. | |
| 2011/0241830 | A1 | 10/2011 | Saito et al. | |
| 2016/0267728 | A1* | 9/2016 | Saito | G07C 9/00944 |

FOREIGN PATENT DOCUMENTS

| | | |
|---|---|---|
| JP | 3332993 B2 | 10/2002 |
| JP | 2003008253 A | 1/2003 |
| JP | 2007273304 A | 10/2007 |
| JP | 2008234961 A | 10/2008 |
| JP | 4900068 B2 | 3/2012 |
| JP | 4947179 B2 | 6/2012 |
| JP | 4948229 B2 | 6/2012 |
| JP | 2012144879 A | 8/2012 |

\* cited by examiner

PORTABLE WIRELESS KEY

CROSS REFERENCE TO RELATED APPLICATIONS

This application is a U.S. National Phase Application under 35 U.S.C. 371 of International Application No. PCT/JP2014/005222 filed on Oct. 15, 2014 and published in Japanese as WO 2015/064033 A1 on May 7, 2015. This application is based on and claims the benefit of priority from Japanese Patent Application No. 2013-225035 filed on Oct. 30, 2013. The entire disclosures of all of the above applications are incorporated herein by reference.

TECHNICAL FIELD

The present disclosure relates to a portable wireless key to perform a control pertaining to locking and unlocking of a vehicle door lock through a wireless communication with a vehicle.

BACKGROUND ART

In recent years, an electronic key system, such as a smart entry system, has a portable wireless key to perform a control pertaining to locking and unlocking of a vehicle door lock. In such a portable wireless key, many rubber knobs are employed for purposes of design and waterproof, for example, as disclosed in a patent literature 1. On and off operations of switches by operating the knobs are usually conducted by push-type switches. The size of the push-type switches has been reduced with a size reduction of the portable wireless key. In the portable wireless key reduced in size, however, a user feels a movable projection of the push-type switch with his or her finger in a pressing operation, and thus an operational feeling is likely to deteriorate.

PRIOR ART LITERATURE

Patent Literature

Patent Literature 1: JP 2003-8253 A

SUMMARY OF INVENTION

It is an object of the present disclosure to provide a portable wireless key that performs at least a control pertaining to locking and unlocking of a vehicle door lock according to a pressing operation of a movable projection of a push-type switch, and which is capable of enhancing an operational feeling in the pressing operation of the movable projection at a low cost.

According to an aspect of the present disclosure, a portable wireless key performs at least a control pertaining to at least locking and unlocking of a vehicle door through a wireless communication with a vehicle. The portable wireless key includes a circuit board, a switch operation cover and a hard deformable cover. The circuit board has a push switch on a surface. The push-switch has a movable projection. The switch operation cover is made of a soft cover material that is capable of being deformed and restored from deformation. The switch operation cover has an operation portion that is deformed to be depressed according to a user's pressing operation and is restored to an original position when being released from the user's pressing operation. The hard deformable cover is made of a hard cover material that is capable of being deformed with an application of a pressing force greater than a pressing force that causes deformation of the operation portion. The hard deformable cover is disposed between the switch operation cover and the push switch. The hard deformable cover is deformed with a depressing deformation of the operation portion when the operation portion is pressed by the user's pressing operation, and is restored to an original position with a restoring deformation of the operation portion to release the movable projection from a pressed state when the operation portion is released from the user's pressing operation.

In the above configuration, the hard deformable cover is disposed between the movable projection and the operation portion of the switch operation cover. When the operation portion is operated by a user, the hard deformable cover is deformed to press the movable projection according to a depressing deformation of the operation portion. Accordingly, an operational feeling of the pressing operation of the movable projection can be improved at a low cost.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

A portable wireless key of a present embodiment is, for example, employed to an electronic key system represented by vehicular keyless entry system, smart entry system, and smart start system. The portable wireless key at least has a wireless communication function to perform a wireless communication with an in-vehicle unit, and performs a control pertaining locking and unlocking of a vehicle door lock through the wireless communication. In such an electronic key system, the in-vehicle unit wirelessly outputs a polling wave toward a predetermined key searching area and wirelessly receives a response signal, thereby to search a portable wireless key present in the key searching area. The in-vehicle unit also authenticates an ID code wirelessly transmitted from the portable wireless key, and performs a predetermined control of the vehicle based on the result of authentication.

The portable wireless key of the present embodiment is configured as a smart key used for a vehicular smart entry system or smart start system. The smart entry system authenticates an ID code wirelessly transmitted from a portable wireless key present in a predetermined key searching area defined on a peripheral area outside of the vehicle, and provides a permission to unlock the door lock based on the result of authentication. When a predetermined unlocking operation of the door lock is detected in the state where the permission for unlocking the door lock is given, a door lock mechanism is operated to unlock the door lock. Namely, the smart entry system performs, based on the result of authentication, a control of switching the vehicle door lock mechanism between the unlock permitted state to enable unlocking according to a predetermined unlock operation and an unlock inhibited state to inhibit the unlocking.

The smart start system authenticates an ID code transmitted from a portable wireless key present in a predetermined key searching area defined in a passenger compartment of a vehicle, and provides a permission to start an engine based on the result of authentication. When a predetermined engine starting operation is detected in the state where the engine start permission is given, the engine is started. Namely, the smart start system performs, based on the result of authentication, a control of switching the vehicle engine between a start permitted state to permit the start of the vehicle engine according to a predetermined engine start operation and a start inhibited state to inhibit the engine start.

Figure 1:
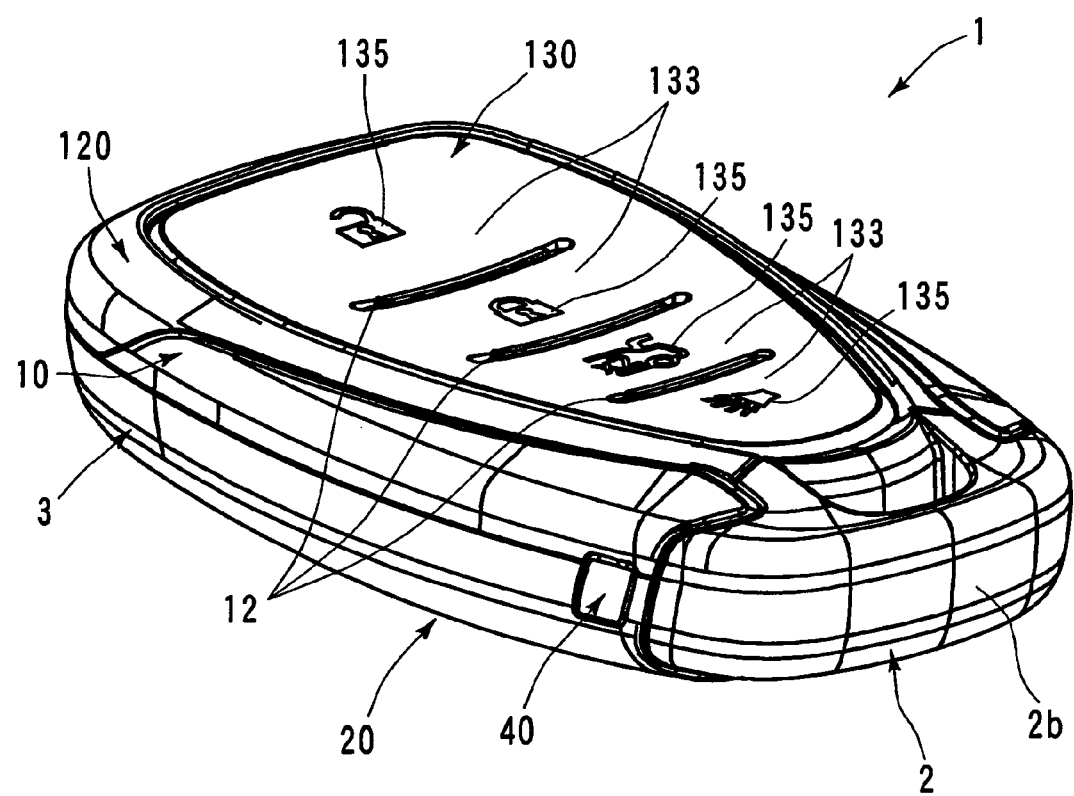
FIG. 1 is a perspective view of a portable wireless key according to an embodiment of the present disclosure.
Figure 2:
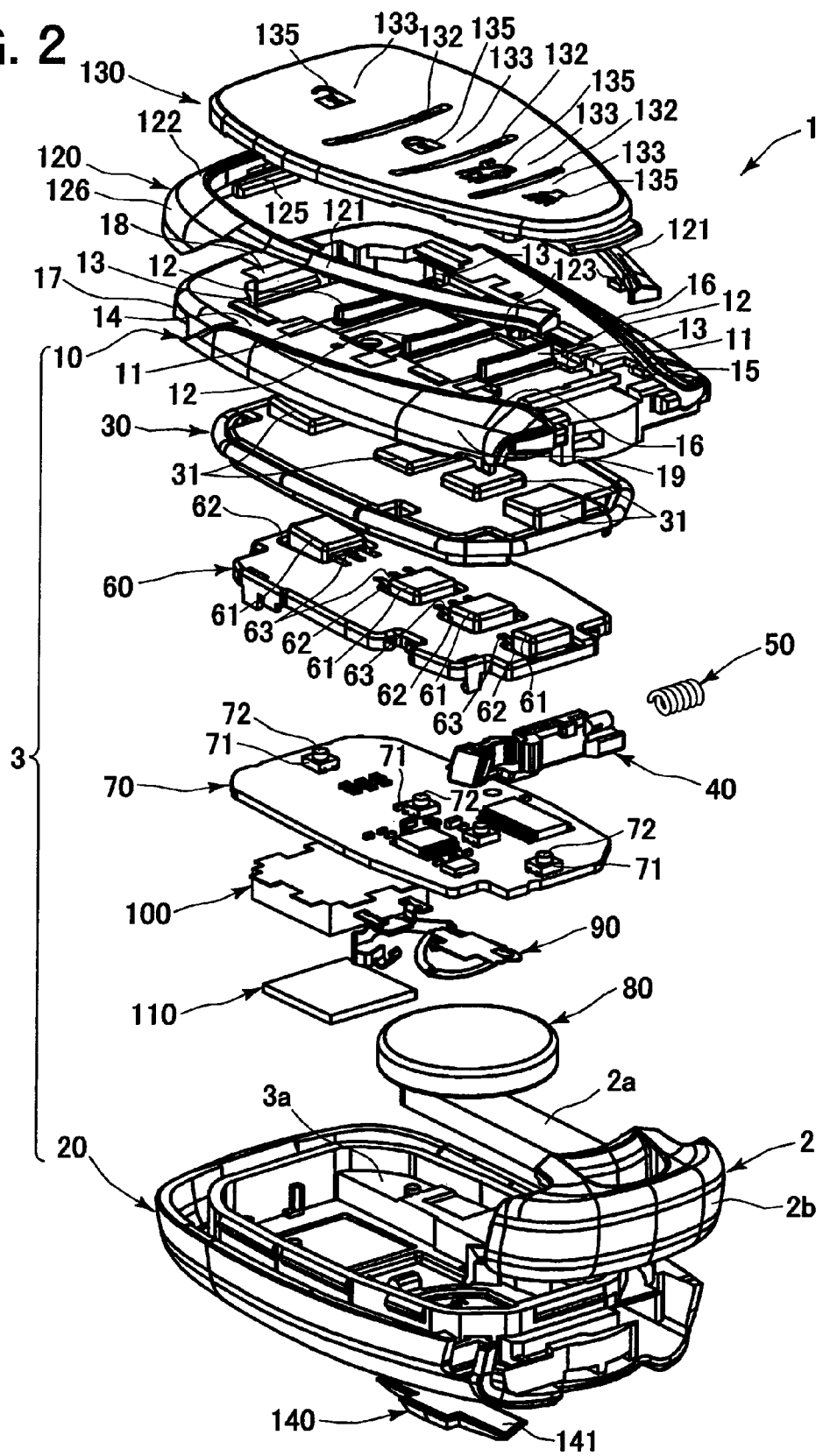
FIG. 2 is an exploded perspective view of the portable wireless key.

Hereinafter, an embodiment of a portable wireless key of the present disclosure will be described with reference to the drawings. As shown in FIG. 1 and FIG. 2, a portable wireless key 1 includes an emergency key 2 and a wireless key body 3. The emergency key 2 is used to directly lock or unlock the vehicle door lock when being inserted to a keyhole of the vehicle door. The wireless key body 3 accommodates the emergency key 2 therein. The emergency key 2 includes a key plate portion 2a to be inserted to the keyhole of the vehicle door, and a key holding portion 2b provided at the end of the key plate portion 2a. The emergency key 2 is held in a state of being inserted into a predetermined accommodation portion 3a inside of the wireless key body 3. The key holding portion 2b exposes outside when the key plate portion 2a is accommodated in the accommodation portion 3a of the wireless key body 3.

The wireless key body 3 has a case shape with substantially a rectangular parallelepiped shape corner portions of which are rounded to define a smooth outline. The wireless key body 3 is formed with the accommodation portion 3a for accommodating the emergency key 2, and the accommodation portion 3a extends in a longitudinal direction of the wireless key body 3. The accommodation portion 3a accommodates the key plate portion 2a so that the key plate portion 2a is received in the longitudinal direction. The accommodation portion 3a has a key groove engagement portion (not shown) that engages with a key groove of the key plate portion 2a accommodated therein. When the key groove of the key plate portion 2a is engaged with the key groove engagement portion of the accommodation portion 3a, the emergency key 2 is in a temporary unremovable and held state (in a state where the emergency key 2 can be removed with a predetermined force or more if a lock is released).

Figure 3:
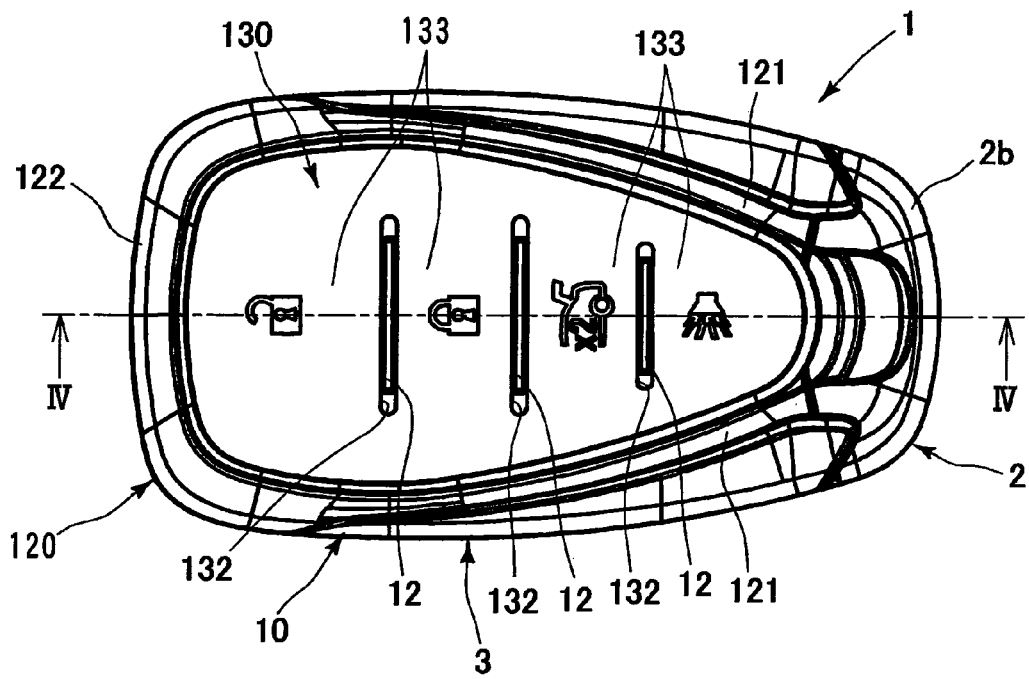
FIG. 3 is a plan view of the portable wireless key.
Figure 4:
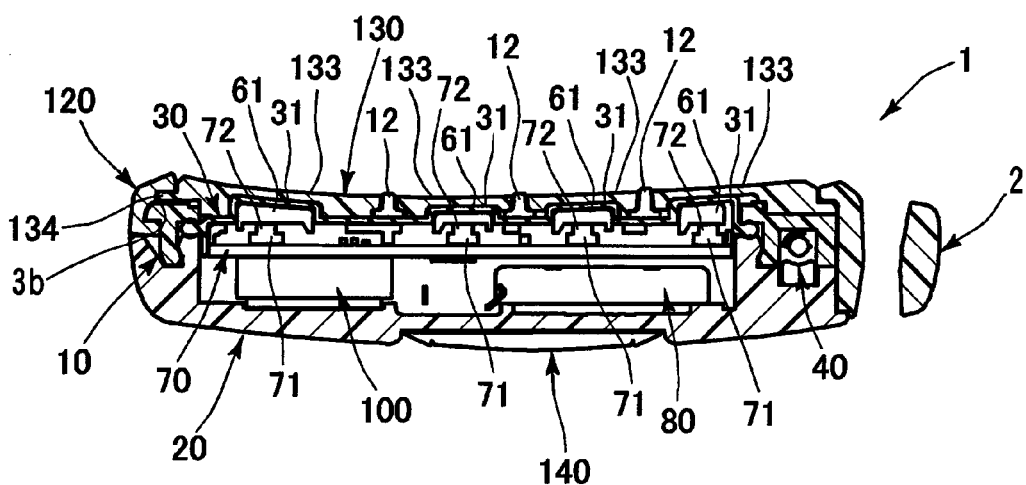
FIG. 4 is a cross-sectional view taken along a line IV-IV of FIG. 3.

The wireless key body 3 is separable up and down in its thickness direction, as shown in FIG. 3 and FIG. 4, and is integrally fixed in the form where an upper case 10 is laid on a lower case 20. The upper case 10 and the lower case 20 are each made of a resin material with high strength, such as a polycarbonate ABS resin (a resin in which polycarbonate resin and ABS resin are mixed). In an inner space provided between the upper case 10 and the lower case 20, an elastically deformable cover 30, a release button 40, a spring 50, a hard deformable cover 60, a circuit board 70, a battery 80, a terminal 90, a LF (low frequency) antenna 100, and a cushion sheet 110 are accommodated. A metal decoration member 120 and a switch operation cover 130 are fixed to an upper surface of the upper case 10, which forms a main surface of the wireless key body 3. An emblem 140 is fixed to a lower surface of the lower case 20.

Figure 5:
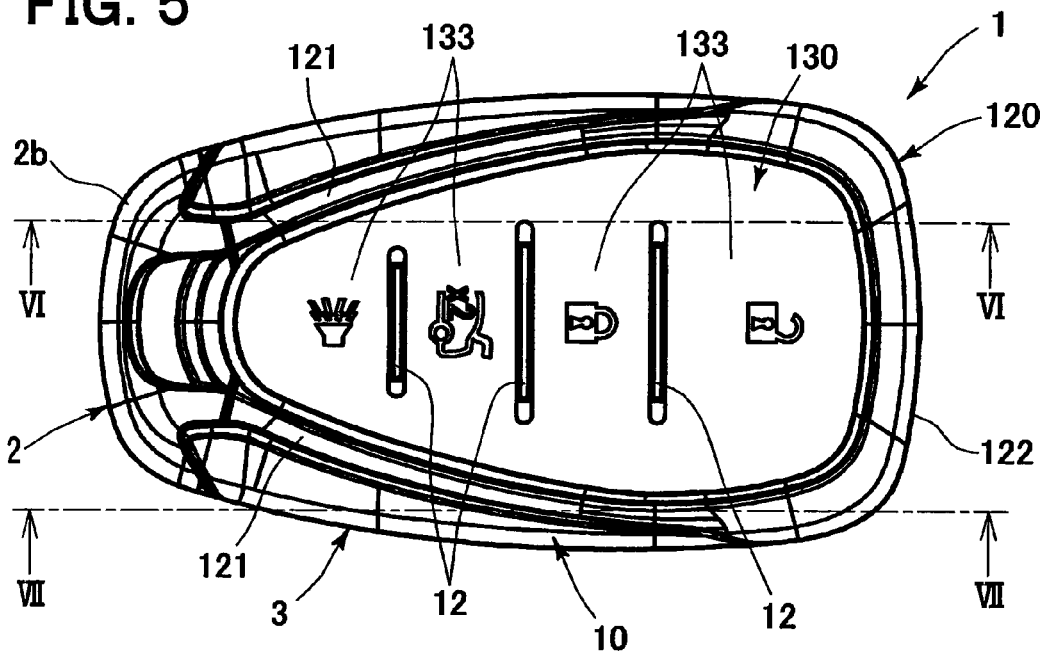
FIG. 5 is a plan view of the portable wireless key.
Figure 6:
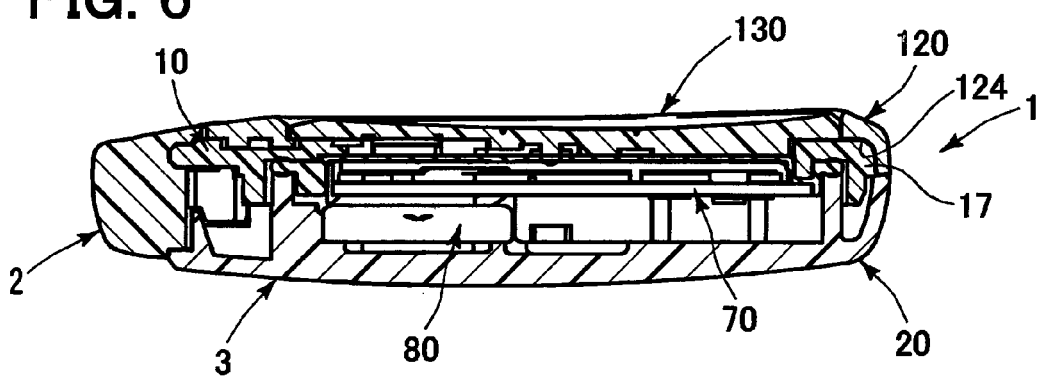
FIG. 6 is a cross-sectional view taken along a line VI-VI of FIG. 5.
Figure 7:
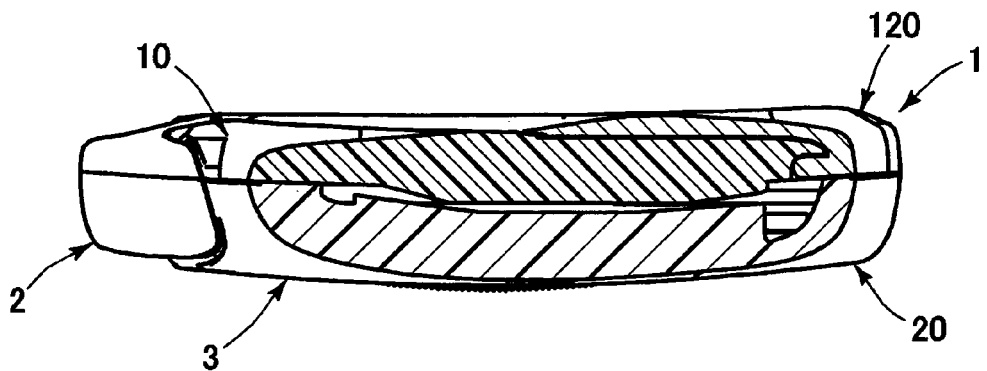
FIG. 7 is a cross-sectional view taken along a line VII-VII in FIG. 5.

As shown in FIG. 5 to FIG. 7, the upper case 10 and the lower case 20 forms a case shape having substantially a rectangular parallelepiped shape corners of which are rounded to define a smooth outline. The upper case 10 is formed with four openings 11 in the longitudinal direction. The openings 11 are each provided for transmitting a depressing deformation of an operation portion 133 of the switch operation cover 30 to a push switch 71 of the circuit board 70, in an assembled state of the portable wireless key 1. The four openings 11 are correspondingly provided for four push switches 71 of the circuit board 70. The upper case 10 is formed with partitioning projections 12 on its upper surface at positions between the respective openings 11 to partition the respective openings 11, that is, to partition the operation portions 133. The upper case 10 is also formed with cover engagement portions 13 for fixing the switch operation cover 130 to the upper case 10. The cover engagement portions 13 are formed on opposite sides of the two openings 11, the two openings 11 being front and rear ends among the four openings 11.

Figure 8:
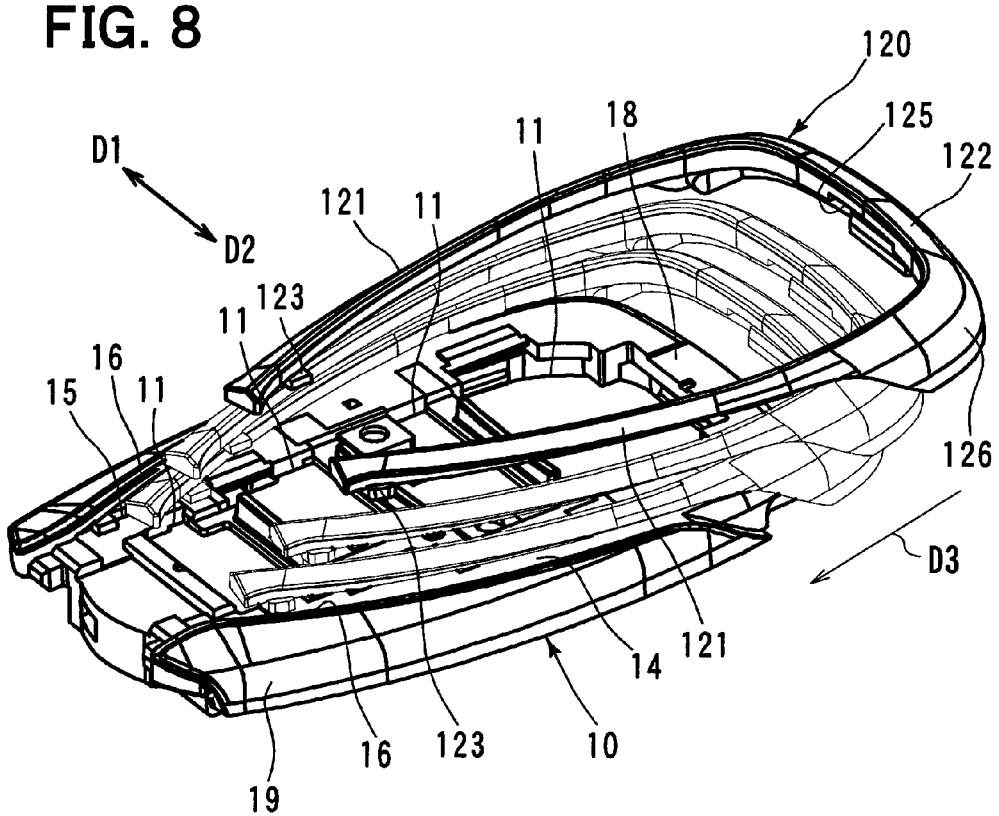
FIG. 8 is a perspective view for illustrating a fixing state of a metal decoration member to an upper case of the portable wireless key.
Figure 9A:
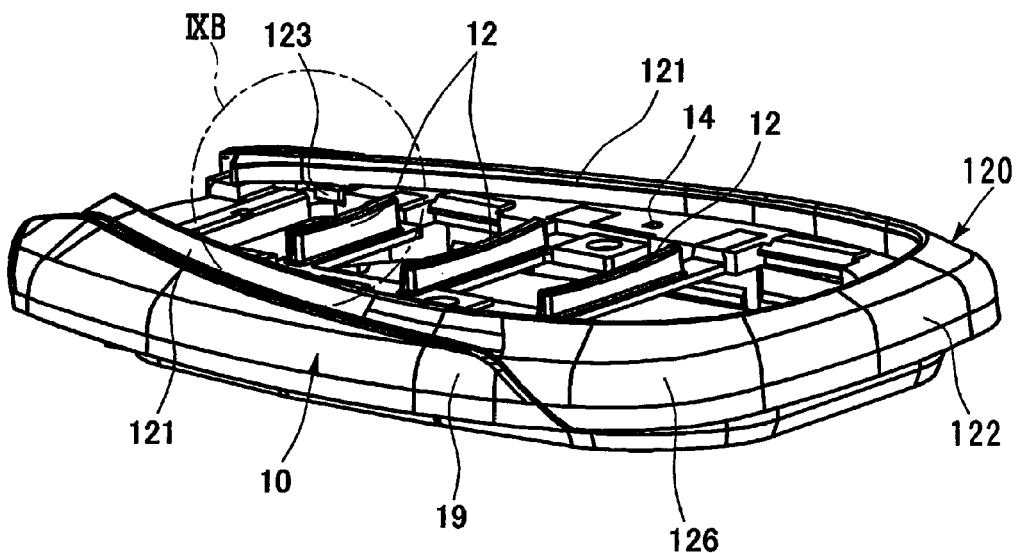
FIG. 9A is a perspective view for illustrating a fitting state of a decoration fitting portion of the metal decoration member and a decoration receiving portion of the upper case.
Figure 9B:
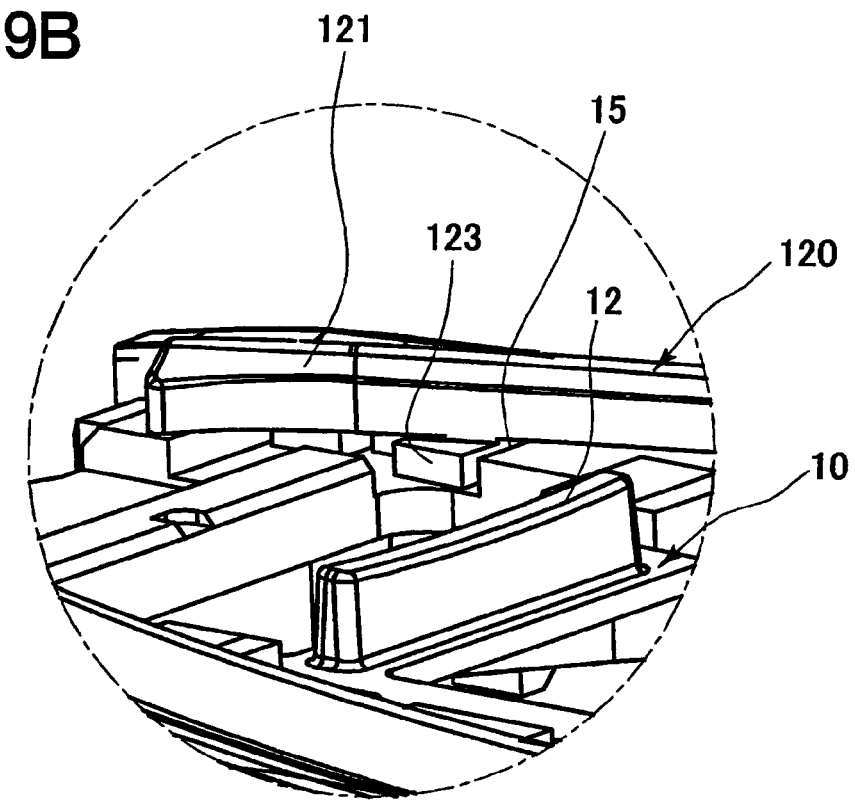
FIG. 9B is an enlarged view of a part IXB of FIG. 9A.

The upper case 10 is formed with a decoration fixing recess 14 on its upper surface for fixing the metal decoration member 120, as shown in FIG. 8 and FIG. 9A. The decoration fixing recess 14 is formed into a recessed surface shape to correspond to an outer shape of the metal decoration member 120. Decoration receiving portions 15, which have a recessed shape, are formed at ends of opposed inner surfaces of the decoration fixing recess 14 to receive the decoration fitting portions 123 of the metal decoration member 120 therein. The opposed inner surfaces of the decoration fixing recess 14, at the ends of which the decoration receiving portions 15 are formed, are each configured as a slide guide portion 16 that guides the decoration fitting portion 123 to the position of the decoration receiving portion 15 in a slide manner (see an arrow D3 in FIG. 8), in a state where end portions 121 of the metal decoration member 120 are deflected inwardly. On the other end (rear end) of the decoration fixing recess 14 opposite to the one end (front end) on which the decoration engagement portions 15 are formed, a pair of right and left decoration engagement portions 17 in the form of projection are formed to respectively engage with the pair of the decoration engaging portions 124 of the metal decoration member 120 (see FIG. 6), and a recess 18 forming the engagement recess 3b for fixing the switch operation cover 130 in the assembled unit with the metal decoration member 120 is formed (see FIG. 12).

The elastically deformable cover 30 is made of a material that hardly absorbs moisture and has elasticity, such as rubber. The elastically deformable cover 30 is fixed to cover the hard deformable cover 60 and the circuit board 70 from the top. Thus, the elastically deformable cover 30 functions to restrict water or the like, which has entered into the switch operation cover 130 through a gap, from reaching the circuit board 70 through the openings 11 of the upper case 10 (i.e., functions as waterproof structure), and functions to transmit a pressing operation (depressing deformation) of the operation portion 133 of the switch operation cover 130 toward the circuit board 70 by being elastically deformed. The elastically deformable cover 30 is formed with projected step portions 31 projecting upwardly in the form of step at positions corresponding to the four operation portion 133 of the switch operation cover 130.

The release button 40 functions as a removing button to remove the emergency key 2 from the wireless key body 3. The spring 50 applies a force to restore the release button 40 operated by a user to the original position.

Figure 10:
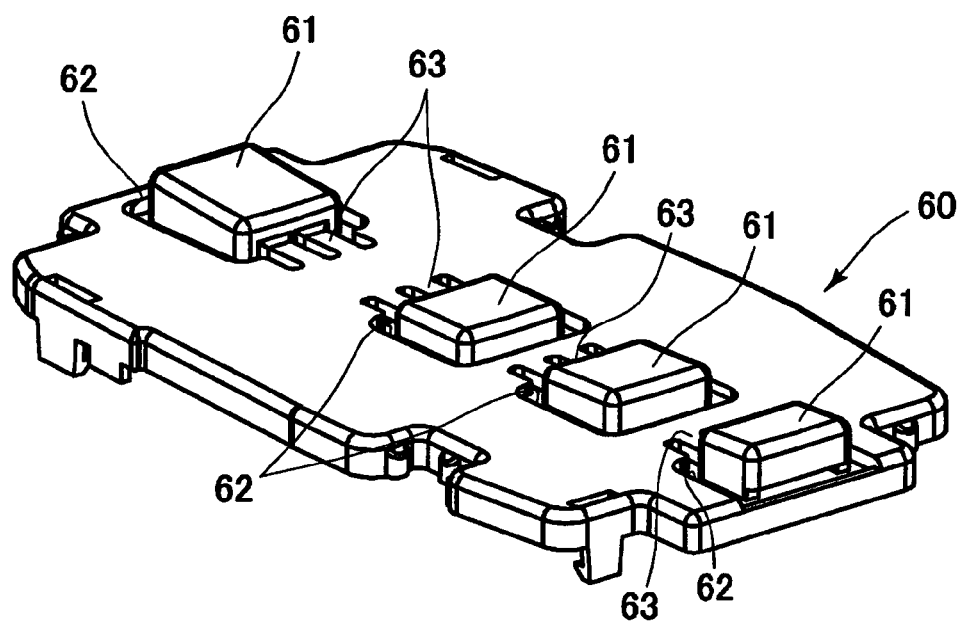
FIG. 10 is an upper perspective view of a hard deformable cover of the portable wireless key.
Figure 11:
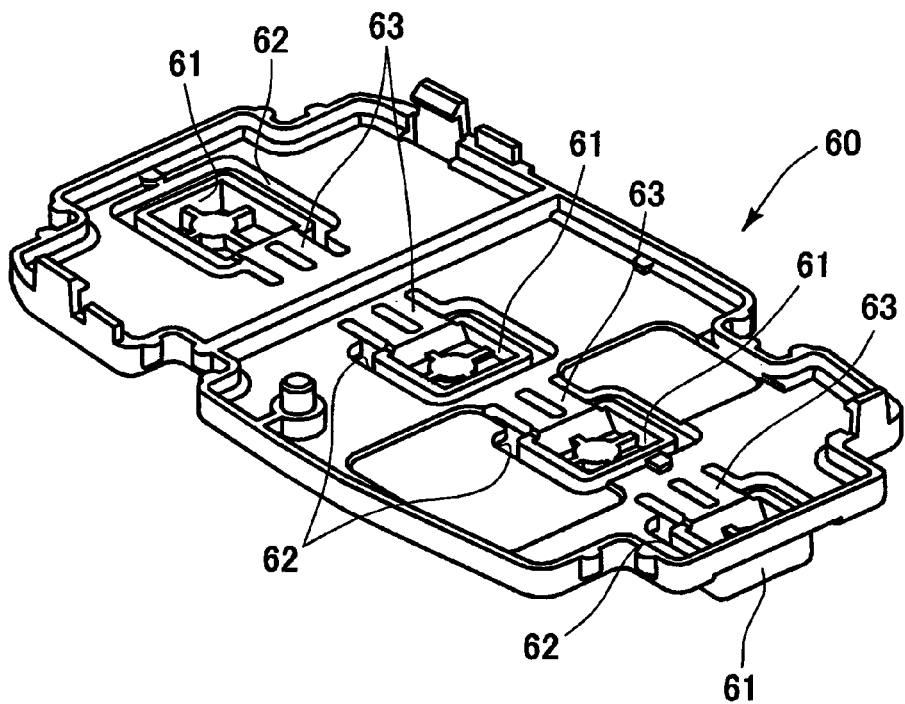
FIG. 11 is a lower perspective view of the hard deformable cover of the portable wireless key.

The hard deformable cover 60 is made of a hard resin material, such as polycarbonate. The hard deformable cover 60 is formed with swing portions 61 at positions corresponding to the four operation portions 133 of the switch operation cover 130, that is, the four push switches 71 of the circuit board 70. The swing portions 61 are in the form of projection projecting upwardly. As shown in FIG. 10 and FIG. 11, a cutout portion 61 is formed at a part on a periphery of each swing portion 61, which is in the form of projection, and a portion of the periphery of the swing portion 61 where the cutout portion 62 is not formed provides a flexible portion 63 that allows the swing portion 61 to move up and down according to the operation of the operation portion 133.

The circuit board 70 has substantially a rectangular plate shape in a plan view. The four push switches 71 of the pressing-button type are mounted on the upper surface of the circuit board 70. The four push switches 71 each have a movable projection 72 for detecting the pressing operation, and is disposed to correspond to the swing portion 61 of the hard deformable cover 60, the projected step portion 31 of the elastically deformable cover 30, the opening 11 of the upper case 10, the operation portion 133 of the switch operation cover 130, which are sequentially laid on top of the other on the circuit board 70. The movable projection 72 is pressed according to the elastic deformation of the pro-jected step portion 31 and the swing motion of the swing portion 61 when the operation portion 133 is operated in a pressed manner. On the lower side of the circuit board 70, the battery 80, the terminal 90 and the LF antenna 100, which are electronic components for the wireless communication with the vehicle, are arranged. The cushion sheet 110 is interposed between the LF antenna 100 and the lower case 20 to absorb an impact to the electronic components through the upper case 10 and the lower case 20.

The metal decoration member 120 is made of a zinc die-casting. The metal decoration member 120 has a U-shape along an outer side surface of the wireless key body 3 (upper case 10), that is, a U-shape corresponding to the decoration fixing recess 14 formed in the upper case 10. The metal decoration member 120 is fixed to the decoration fixing recess 14. The metal decoration member 120, which has the U-shape, includes a pair of side portions 121 extending from one end to another end, and a connecting portion 122 connecting between the pair of side portions 121. The side portions 121 are flexible in the right and left direction of the metal decoration member 120 (D1 and D2 directions in FIG. 8). The side portions 121 have decoration fitting portions 123 for fitting in the decoration receiving portions 15 of the upper case 10 at tip ends thereof.

The connecting portion 122 has a pair of decoration engaging portions 124 correspondingly engaging with the pair of decoration engagement portions 17 of the upper case 10. Also, the connecting portion 122 is formed with a recessed portion 125 that forms an engagement recess 3b with the recess 18 of the upper case 10 in the assembled unit with the upper case 10. The outer surface 126 of the metal decoration member 120 has a shape that forms a continuously curved surface with the outer surface 19 of the upper case 10 in a state where the metal decoration member 120 is fixed to the decoration fixing recessed portion 14 of the wireless key body 3 (upper case 10).

Figure 12:
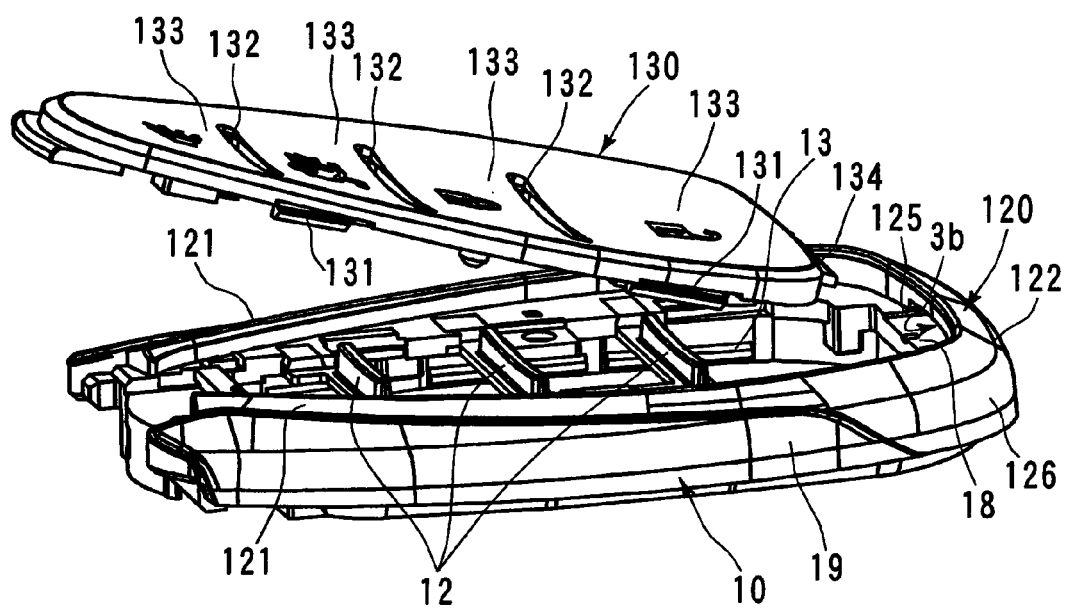
FIG. 12 is a perspective view for illustrating a fixing state of a switch operation cover to an assembled unit of the metal decoration member and the upper case.
Figure 13A:
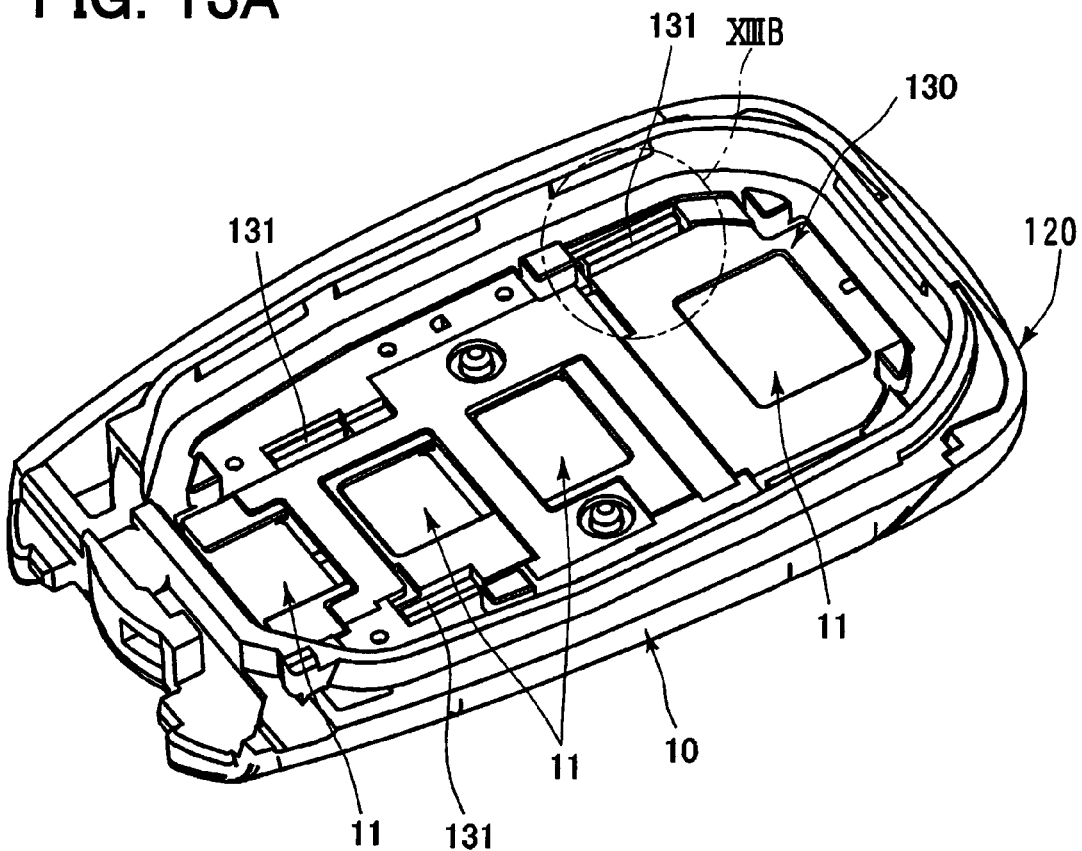
FIG. 13A is a perspective view for illustrating an engagement state of a cover engaging portion of the switch operation cover and a cover engagement portion of the upper case.
Figure 13B:
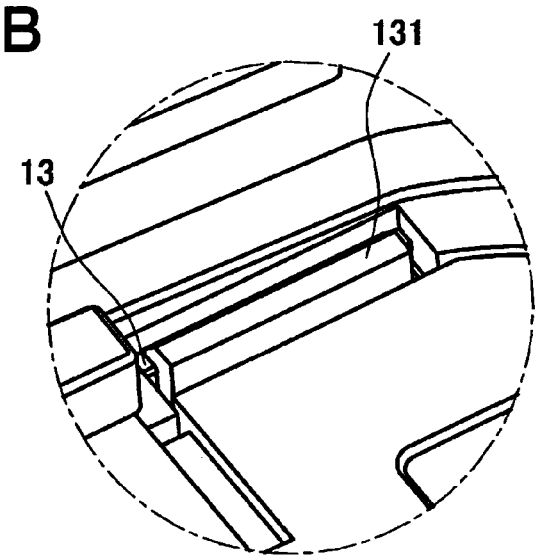
FIG. 13B is an enlarged view of a part XIIIB of FIG. 13A.
Figure 14:
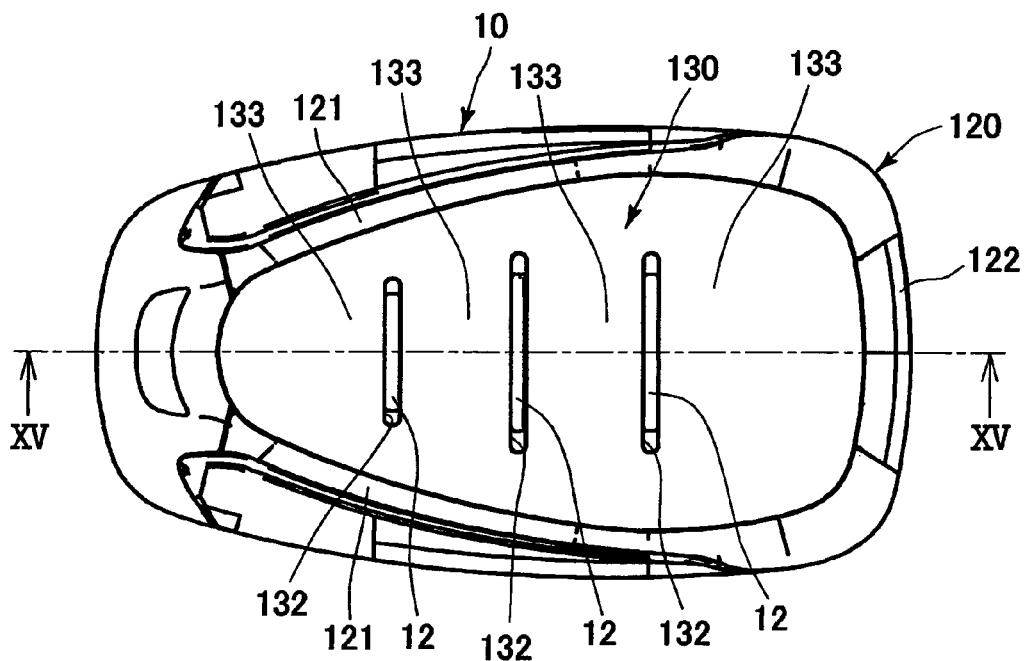
FIG. 14 is a plan view of an assembled unit of the metal decoration member, the upper case and the switch operation cover.
Figure 15:
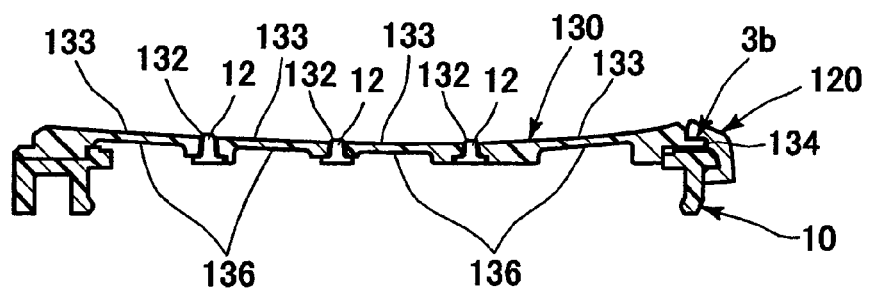
FIG. 15 is a cross-sectional view taken along a line XV-XV in FIG. 14.
Figure 16A:
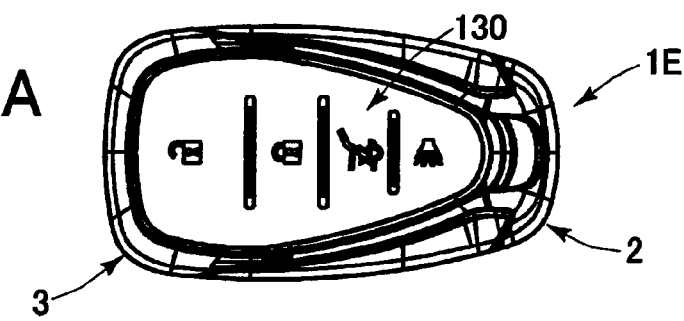
FIG. 16A is a plan view of an example of a portable wireless key having a different function according to the type of a switch operation cover.
Figure 16B:
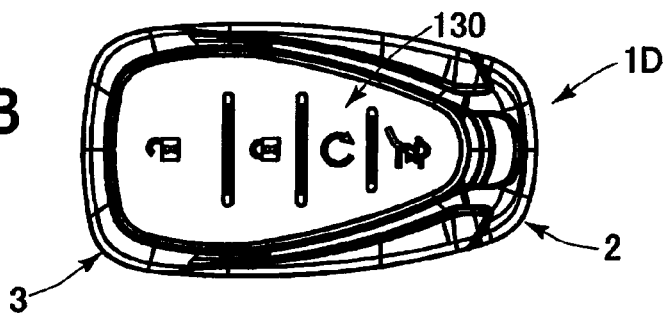
FIG. 16B is a plan view of an example of a portable wireless key having a different function according to the type of a switch operation cover.
Figure 16C:
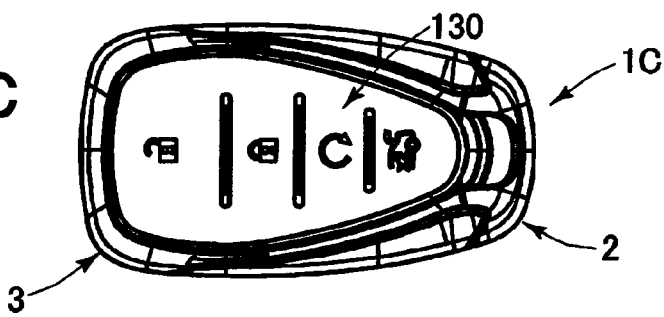
FIG. 16C is a plan view of an example of a portable wireless key having a different function according to the type of a switch operation cover.
Figure 16D:
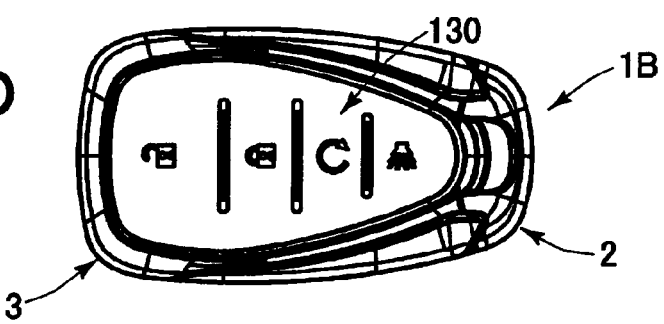
FIG. 16D is a plan view of an example of a portable wireless key having a different function according to the type of a switch operation cover.
Figure 16E:
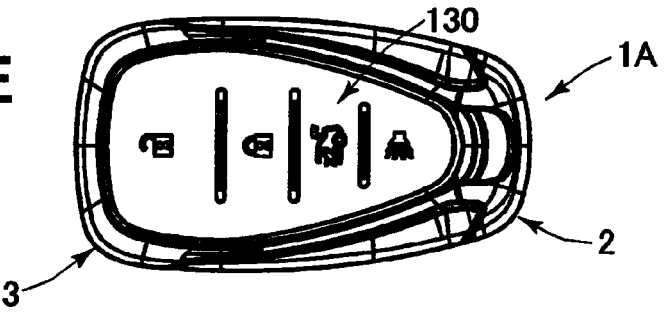
FIG. 16E is a plan view of an example of a portable wireless key having a different function according to the type of a switch operation cover.

The switch operation cover 130 has a flat portion made of a rubber material and a resin portion integrally molded with the flat portion on the lower surface of the flat portion. On a lower surface portion of the switch operation cover 130 made of the resin material, as shown in FIG. 12, FIG. 13A and FIG. 13B, nail-shaped cover engaging portions 131 are formed for fixing the switch operation cover 130 to the upper case 10 when engaged with the cover engagement portions 13. As shown in FIG. 14 and FIG. 15, the switch operation cover 130 is formed with insertion groove portions 132 for correspondingly receiving the three partitioning projections 12 of the upper case 10. The four areas partitioned by the insertion groove portions 132 form the operation portions 133 that are individually operated for pressing the four push switches 71. The switch operation cover 130 has an engagement projection 134 for fixing at its rear end to be engaged with the engagement recessed portion 3b of the assembled unit of the upper case 10 and the metal decoration member 120.

The four push switch 71 are switches for controlling functions of unlocking and locking of the door lock, opening a trunk of the vehicle, generating an alarm. On the four surfaces of the operation portions 133 of the switch operation cover 130, design marks 135 for schematically indicating the respective functions are pad-printed. On the rear surface of each operation portion 133, a recessed surface portion 136 for receiving the swing portion 61 of the hard deformable cover 60 through the projected step portion 31 of the elastically deformable cover 30 is formed. The emblem 140 is fixed to the lower outer surface of the lower case 20 through an adhesive tape 141 adhered to the lower outer surface of the lower case 20.

The portable wireless key 1 of the present embodiment is configured to control the functions of the unlocking and locking of the door lock, opening the trunk of the vehicle, generating the alarm, as described above. However, the functions to be controlled by the portable wireless key 1 (four push switches 71) are not limited to the functions described above. For example, in a case where the functions to be controlled by the portable wireless key 1 (four push switches 71) are changed with various specifications, a switch operation cover 130 having design marks 135 according to the changed specifications is merely fixed. Thus, it can be easily addressed to various switches without increasing initial costs.

By replacing a switch operation cover 130 having different design marks 135, various portable wireless keys, such as portable wireless keys 1E to 1A as shown in FIG. 16A to 16E can be made as switch variations of the portable wireless key 1 of the present embodiment. A portable wireless key 1A as the portable wireless key 1 of the present embodiment has the control functions of the locking and unlocking of the door lock, the opening of the trunk, and the generation of the alarm. The portable wireless key 1B has control functions of locking and unlocking of the door lock, remote starting, and generating an alarm. The portable wireless key 1C has control functions of locking and unlocking of the door lock, remote starting, and opening a vehicle trunk. The portable wireless key 1D has control functions of locking and unlocking of the door lock, remote starting and opening of a back door. The portable wireless key 1E has control functions of locking and unlocking of the door lock, opening of the back door, and generating an alarm.

In the present embodiment, as described above, the portable wireless key 1 performs at least the control pertaining the unlocking and locking of the vehicle door lock through the wireless communication with the in-vehicle unit. The portable wireless key 1 includes the circuit board 70, the switch operation cover 130 and the hard deformable cover 60. The circuit board 70 has the push switches 71 on the surface. The push switches 71 have the movable projections 72. The switch operation cover 130 is made of a soft cover material that allows deformation and restoration from the deformation. The switch operation cover 130 has the operation portions 133 that are deformed to depress by the user's pressing operation, and to restore when being released from the user's pressing operation. The hard deformable cover 60 is made of a hard cover material that can be deformed as being applied with a pressing force greater than a pressing force that deforms the operation portions 133. The hard deformable cover 60 is disposed between the switch operation cover 130 and the push switches 71. The hard deformable cover 60 deforms according to the depressing deformation of the operation portion 133 when the operation portion 133 is operated in a pressed manner, to thereby press the movable projection 72. When the operation portion 133 is released from the user's pressing operation, the hard deformable cover 60 restores to the original position and releases the pressed state of the movable projection 72.

As described above, the hard deformable cover 60 is disposed between the movable projections 72 of the push switches 71 and the operation portions 133 of the switch operation cover 130. When the user presses the operation portion 133, the hard deformable cover 60 deforms with the depressing deformation of the operation portion 133 to press the movable projection 72. Thus, the operational feeling of the movable projections 72 can be improved at a low cost.

As the improvement of the hard deformable cover 60 obtained by interposing the hard deformable cover 60 between the push switches 71 and the operation portions 133, the distance between the operation portions 133 and the push switches 71 can be ensured without increasing the thickness of the elastic body of the switch operation cover 130 or the elastically deformable cover 30. Thus, the operational feeling can be ensured without losing the click feeling of the movable projections 72 of the push switches 71. Further, it is easy to achieve the effect of such as according the shape of the top surface of the hard deformable cover 60 with the shape of finger. Thus, it is easy to optimize the operational feeling. In the structure where the hard deformable cover 60 is disposed between the push switches 71 and the operation portions 133, the top surfaces of the push switches 71 are totally covered with the hard deformable cover 60. Therefore, this structure achieves an effect of being applicable to authentication of electric waves of the portable wireless key 1 as a wireless device.

The multiple push switches 70 are disposed on the circuit board 70. The switch operation cover 130 has the operation portions 133 that are correspondingly provided for the push switches 71. Since the integral hard deformable cover 60 is provided for the multiple push switches 71, the number of components can be reduced, and the integral hard deformable cover 60 can be fixed in a non-operated state.

The elastically deformable cover 30 is disposed between the switch operation cover 130 and the hard deformable cover 60. The elastically deformable cover 30 can be elastically deformed and restored. When the operation portion 133 is pressed by a user, the elastically deformable cover 30 is deformed in a depressed manner so that the operation portion 133 is deformed and depressed to transmit the deformation toward the hard deformable cover 60. When the operation portion 133 is released from the user's pressing operation, the elastically deformable cover 30 is deformed and restored to the original position in accordance with the restoring deformation of the operation portion 133. Since the circuit board 70 can be covered with the elastically deformable cover 30, which is made of an elastic member and has less moisture absorption, from the top. Thus, the elastically deformable cover 30 can avoid water or the like having entered through a gap defined between the switch operation cover 130 and the deformable cover 30 from entering toward the circuit board 70, and thus provides a waterproof structure to the portable wireless key 1.

The hard deformable cover 60 has the swing portions 61 at positions located between the operation portions 133 and the movable projections 72. The had deformable cover 60 is formed with the cutout portions partially on the periphery of the swing portions 61 to allow the swing portions 61 to deflect up and down. Each of the swing portions 61 moves down when the corresponding operation portion 133 is deformed and depressed by the user's pressing operation, and moves up in accordance with the restoring deformation of the operation portion 133 when the operation portion 133 is released from the user's pressing operation. Therefore, the pressing operation of the operation portion 133 can be transmitted to the movable projection 72 of the push switch 71 through the swing operation of the swing portion 61. As such, it is less likely that the push switch 71 (movable projection 72) will be pushed obliquely (oblique pushing). Namely, an unexpected pushing operation such as the oblique pushing which influences on the life of the push switch 71 can be reduced.

The switch operation cover 130 is formed with the recessed surface portions 136 for receiving the swing portions 61 therein on the rear surface. Therefore, in the assembled state as the portable wireless key 1, the sense of unity can be provided between the switch operation cover 130 and the hard deformable cover 60. Further, the operation portions 133 of the switch operation cover 130 and the swing portions 61 of the hard deformable cover 60 can be positioned relative to each other. Therefore, the displacement of the operation portions 133 and the swing portions 61 and the oblique pushing can be avoided, and it is less likely that a user will feel uncomfortable in operation.

The embodiment of the present disclosure is described hereinabove. However, the embodiments described hereinabove are only examples, and the present embodiment is not limited to the embodiments. Variable modifications may be adoptable without departing from the gist of the claims. In the structure described in the above embodiment, the metal decoration member is exemplarily made of the zinc diecasting. However, the metal decoration member is not limited to such a material. The metal decoration member may have any configuration as long as it is made of a metal material.

In the embodiment described above, the metal decoration member is fixed to the upper case forming the main surface (the surface to which the operation portion is disposed) of the wireless key body. However, the structure of the wireless key body is not limited such a structure. The metal decoration member may be fixed to the lower case, which forms the surface opposite to the main surface of the wireless key body, or may be fixed to extend over the upper case and the lower case.

The shape of the metal decoration member having the pair of the side portions extending from the rear end to the front end and the connecting portion connecting between the pair of the side portions is described as having the U-shape. However, the U-shape is not limited to an exact U-shape (i.e., the connecting portion have the curved shape). The shape of the metal decoration member may have a gate-like shape (e.g. a shape in which the connecting portion has a straight shape, and the pair of side portions extending perpendicularly from the connecting portion). That is, the metal decoration member may have a shape having an opening on one side.

What is claimed is:

1. A portable wireless key that performs at least a control pertaining to locking and unlocking of a door lock of a vehicle through a wireless communication with the vehicle, the portable wireless key comprising:
    a circuit board having a push switch on a surface, the push switch having a movable projection;
    a switch operation cover made of a soft cover material that is capable of being deformed and restored from deformation, the switch operation cover having an operation portion that is deformed to be depressed according to a user's pressing operation and is deformed to be restored to an original position when being released from the user's pressing operation, the switch operation cover having a recessed surface portion defining a recess on a rear side of the switch operation cover at a position corresponding to the operation portion;
    a hard deformable cover made of a hard cover material that is capable of being deformed with an application of a pressing force greater than a pressing force that causes deformation of the operation portion, the hard deformable cover being disposed between the switch operation cover and the circuit board, the hard deformable cover having a base plate portion and a swing portion at a position located between the operation portion and the movable projection, the swing portion being configured to protrude toward the switch operation cover from a top surface of the base plate portion and to be received in the recess of the recessed surface portion of the switch operation cover, the swing portion being configured to move down according to a depressing deformation of the operation portion when the operation portion is pressed by the user's pressing operation thereby to press the movable projection, and to move up and to be restored to an original position with a restoring deformation of the operation portion to release the movable projection from a pressed state when the operation portion is released from the user's pressing operation; and
    an elastically deformable cover disposed between the switch operation cover and the hard deformable cover, the elastically deformable cover having a projected step portion projecting toward the operation portion at a position located between the operation portion and the swing portion.

2. The portable wireless key according to claim 1, wherein the circuit board has a plurality of push switches including the push switch,
    the switch cover has a plurality of operation portions including the operation portion, and
    the plurality of operation portions are correspondingly provided for the plurality of push switches.

3. The portable wireless key according to claim 2, wherein the hard deformable cover has a plurality of swing portions including the swing portion, and
    the plurality of swing portions are correspondingly provided for the plurality of push switches,
    the portable wireless key further comprising an upper case and a lower case that are fixed to each other to form an inner space in which the circuit board, the elastically deformable cover and the hard deformable cover are accommodated, wherein
    the switch operation cover is provided at a top surface of the upper case,
    the upper case has a plurality of openings at positions corresponding to the plurality of operation portions, and
    each projected step portion and each swing portion are received in a corresponding recess of the switch operation cover through a corresponding opening of the upper case.

4. The portable wireless key according to claim 3, wherein the switch operation cover has a curved top surface, and
    the plurality swing portions have top surfaces corresponding to the curved top surface of the switch operation cover.

5. The portable wireless key according to claim 1, wherein the elastically deformable cover has an elasticity and is capable of being deformed and restored from deformation,
    the projected step portion of the elastically deformable cover is deformed to be depressed, when the operation portion is pressed by a user, to transmit the depressing deformation of the operation portion to the swing portion of the hard deformable cover, and
    the projected step portion of the elastically deformable cover is deformed to be restored to an original position according to the restoring deformation of the operation portion when the operation portion is released from the user's pressing operation.

6. The portable wireless key according to claim 5, wherein the hard deformable cover is formed with a cutout portion at a part of a periphery of the swing portion to allow the swing portion to move up and down relative to the base plate portion.

7. The portable wireless key according to claim 6, wherein a thickness of the switch operation cover is smaller at the position corresponding to the operation portion due to the recess than at a position corresponding to the base plate portion, and the swing portion and the projected step portion are received in the recess.

8. The portable wireless key according to claim 1, further comprising:
an upper case and a lower case being made of a resin material, wherein
the upper case and the lower case are fixed to each other while accommodating the circuit board and the hard deformable cover in an inner space provided between the upper case and the lower case, thereby to form a wireless key body, and
the switch operation cover is fixed to a front surface of the upper case.

9. The portable wireless key according to claim 1, wherein the hard deformable cover covers the circuit board, and has a plurality of engagement nail portions engagable with the circuit board.

10. The portable wireless key according to claim 1, wherein
the movable projection of the push switch has a substantially cylindrical shape and projects from a top surface of a base portion of the push switch toward a rear surface of the swing portion of the hard deformable cover,
the swing portion is larger than the push switch in a direction parallel to a plane of the circuit board, and covers the movable projection of the push switch, and
the rear surface of the swing portion is in direct contact with a top surface of the movable projection.

11. The portable wireless key according to claim 1, wherein
a thickness of the swing portion at least at a position corresponding to the movable projection is greater than a thickness of the base plate portion.

* * * * *